United States Patent
Harada et al.

(10) Patent No.: US 7,468,554 B2
(45) Date of Patent: Dec. 23, 2008

(54) HEAT SINK BOARD AND MANUFACTURING METHOD THEREOF

(75) Inventors: Kouji Harada, Hitachinaka (JP); Hiroatsu Tokuda, Hitachinaka (JP); Kazuo Ojima, Hitachinaka (JP); Masayuki Kobayashi, Mito (JP)

(73) Assignee: Hitachi, Ltd., Tokyo (JP)

( * ) Notice: Subject to any disclaimer, the term of this patent is extended or adjusted under 35 U.S.C. 154(b) by 26 days.

(21) Appl. No.: 10/587,480

(22) PCT Filed: Mar. 11, 2005

(86) PCT No.: PCT/JP2005/004861

§ 371 (c)(1),
(2), (4) Date: Jul. 27, 2006

(87) PCT Pub. No.: WO2005/091363

PCT Pub. Date: Sep. 29, 2005

(65) Prior Publication Data

US 2007/0147005 A1    Jun. 28, 2007

(30) Foreign Application Priority Data

Mar. 18, 2004    (JP) .............................. 2004-077371

(51) Int. Cl.
*H01L 23/10*    (2006.01)
*H01L 23/34*    (2006.01)

(52) U.S. Cl. ............... 257/706; 257/707; 257/E23.081; 257/E23.101; 257/E23.102; 257/E23.103

(58) Field of Classification Search ................ 257/706, 257/707, E23.081, E23.101, E23.102
See application file for complete search history.

(56) References Cited

FOREIGN PATENT DOCUMENTS

| JP | 6-77678 A | 3/1994 |
|---|---|---|
| JP | 8-186204 A | 7/1996 |
| JP | 9-225562 A | 9/1997 |
| JP | 11-317478 A | 11/1999 |
| JP | 2000-77582 A | 3/2000 |
| JP | 2000-151163 A | 5/2000 |

OTHER PUBLICATIONS

International Search Report dated Jun. 14, 2005, including an English translation (Four (4) pages).

*Primary Examiner*—Ngan Ngo
(74) *Attorney, Agent, or Firm*—Crowell & Moring LLP

(57) ABSTRACT

A heat sink board having a first heat sink and a second heat sink with a smaller linear expansion coefficient than that of the first heat sink and being bonded to the first heat sink to form the heat sink board. The second heat sink is fitted to the first heat sink, and a material of the first heat sink in the vicinity of a boundary between the fitted heat sinks is plastically deformed for close adhesion to the second heat sink. A forming method makes bonding between the first and second heat sinks possible at room temperature, and the heat sink board made of a composite member having a high flat-surface accuracy can be easily and reliably obtained.

10 Claims, 4 Drawing Sheets

HEAT SINK BOARD AND MANUFACTURING METHOD THEREOF

TECHNICAL FIELD

The present invention relates to a heat sink board and a manufacturing method thereof. More particularly, the present invention relates to a heat sink board suitable for mounting an electronic component generating heat in large amount, in particular a semiconductor component, such as an inverter or a power module used in an electric vehicle, and also relates to a manufacturing method of the heat sink board.

BACKGROUND ART

Hitherto, a heat sink board for mounting an electronic component generating heat in large amount, in particular a semiconductor component, has been basically made of a copper (Cu) material and generally formed of a one-piece plate. That type of heat sink board is inexpensive because of using a one-piece plate and has good heat radiation because of using copper as the material.

However, the copper (Cu) material has a large linear expansion coefficient of 16.6 (ppm/° C.) and faces a problem that heat generated from the mounted semiconductor component causes a crack due to thermal stress generated in a surface bonded using a solder, which has a different linear expansion coefficient. To prevent the occurrence of such a crack, it is also known to constitute a heat sink board in the form of a one-piece plate using, instead of the copper material, a copper-molybdenum (Cu—Mo) composite material that has a small linear expansion coefficient of 9.2 (ppm/° C.) and relatively good heat radiation.

In that case, however, the heat sink board is very expensive because the one-piece board is made of the Cu—Mo composite material containing a large amount of molybdenum (Mo) that has a high material cost.

Patent Document 1 (JP,A 8-186204) discloses a heat sink board comprising a mount portion made of a material having a thermal expansion coefficient close to that of a semiconductor device, and a heat radiating member made of a material having superior thermal conduction and dissipation characteristics, the mount portion and the heat radiating member being brought into an integral structure by infiltration bonding under heating.

Patent Document 2 (JP,A 6-77678) discloses a heat sink board in which a hole is formed in a predetermined position of a base material made of a nickel-iron alloy, and a heat radiating member made of a copper-based metal is embedded in the hole by screwing or pressing, thereby forming an integral board.

The heat sink board made of plural members must be held in close adhesion to a heat generating source in order to radiate heat with high efficiency. When the heat generating source is a semiconductor, for example, the semiconductor is mounted to the board by soldering, and hence the heat sink board is required to have satisfactory product accuracy, such as high flatness.

However, the former Patent Document 1 has the problem that, because of using the bonding method performed under application of heat, such as welding or brazing, the bonding accuracy is reduced due to a thermal deformation, etc., and mechanical machining is required on a soldered surface or other relevant surface after the bonding. The application of heat also makes Patent Document 1 disadvantageous in points of energy loss and material yield.

With the latter Patent Document 2 using the screwing method, the degree of close adhesion between the base material and the heat radiating member in the fastened portion is low and a sufficient effective screw length cannot be obtained in a thin plate like the heat sink board. Also, the screwing method accompanies with a risk of loosening. Further, the pressing method is disadvantageous in points of productivity and cost. In other words, because the pressing imposes deformation pressure on the heat radiating member made of a relatively soft material, desired flatness is hard to obtain and a flat-surface finishing step is required in some cases.

An object of the invention is to provide a heat sink board and a manufacturing method thereof, which can realize a high product accuracy and superior productivity.

DISCLOSURE OF THE INVENTION

To achieve the above object, the present invention provides a heat sink board formed by bonding, to a first heat sink, a second heat sink having a smaller linear expansion coefficient than that of the first heat sink, wherein the second heat sink is fitted to the first heat sink, and a material of the first heat sink in the vicinity of a boundary between the fitted heat sinks is plastically deformed for close adhesion to the second heat sink.

In the present invention, preferably, the second heat sink is a chip member for mounting a semiconductor component.

In the present invention, preferably, the first heat sink has a plastic-bonding pressed groove, which is formed in a bonded surface thereof at the boundary between the fitted heat sinks and which receives the second heat sink.

In the present invention, preferably, the first heat sink is made of a Cu-based material, and the second heat sink is made of a Cu—Mo composite material.

In the present invention, preferably, an entire peripheral edge of the second heat sink is exposed with formation of a pressing mark recessed by the plastic flow bonding.

In the present invention, preferably, the semiconductor component is fixed to the second heat sink by soldering.

In the present invention, preferably, the first heat sink and the second heat sink are bonded to each other by the plastic flow bonding with a thermally conductive paste or wax interposed between an inner peripheral surface of the first heat sink and an outer peripheral surface of the second heat sink.

In the present invention, preferably, the first heat sink and the second heat sink are bonded to each other by the plastic flow bonding with a thermally conductive paste or wax interposed between a bottom surface of the first heat sink and a lower surface of the second heat sink.

To achieve the above object, the present invention also provides a method of manufacturing a heat sink board formed by bonding, to a first heat sink, a second heat sink having a smaller linear expansion coefficient than that of the first heat sink, the method comprising the steps of:

fitting the second heat sink into a fitting hole formed in the first heat sink, and locally plastically deforming a material in a peripheral portion of the first heat sink in contact with the second heat sink by a bonding punch which is descended along an outer peripheral wall of the second heat sink, thereby integrating the two heat sinks with each other by plastic flow bonding.

Thus, in the heat sink board according to the present invention, the second heat sink is fitted to the fitting hole of the first heat sink, and the material of the first heat sink at the boundary between the fitted heat sinks is plastically deformed for bonding to the second heat sink. As a result, the bonding between the first and second heat sinks can be preformed at room temperature, and the heat sink board made of a composite member and having a high flat-surface accuracy can be easily and reliably obtained.

Also, according to the present invention, since the heat sink board is manufactured by fitting the second heat sink to the first heat sink and locally plastically deforming the material in the peripheral portion of the first heat sink in contact with the second heat sink by the bonding punch which is descended along the outer peripheral wall of the second heat sink, thereby integrating the two heat sinks with each other by plastic flow bonding, the plastic-bonding pressed groove (pressing mark) formed in the first heat sink by the pressing near the second heat sink (chip) serves to prevent a solder from overflowing with no need of a special jig when the semiconductor is mounted, and the heat sink for mounting a heat generating component can be manufactured with high productivity.

BEST MODE FOR CARRYING OUT THE INVENTION

Concrete embodiments of the present invention will be described below. Note that the present invention is not limited to the following embodiments, and it can be widely applied to any types of heat sink boards for mounting heat generating components.

EMBODIMENT 1

Figure 1:
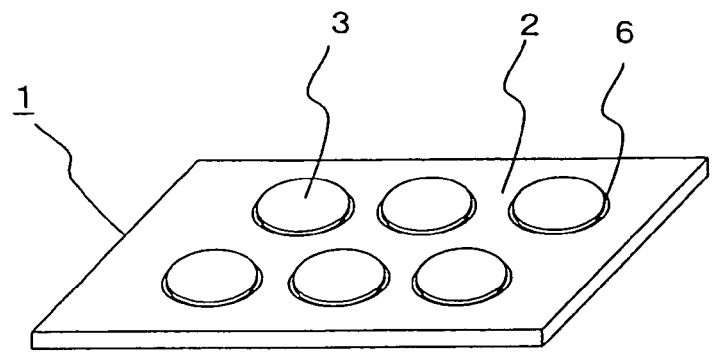
FIG. 1 is a perspective view of a heat sink board showing one embodiment of the present invention.
Figure 2:
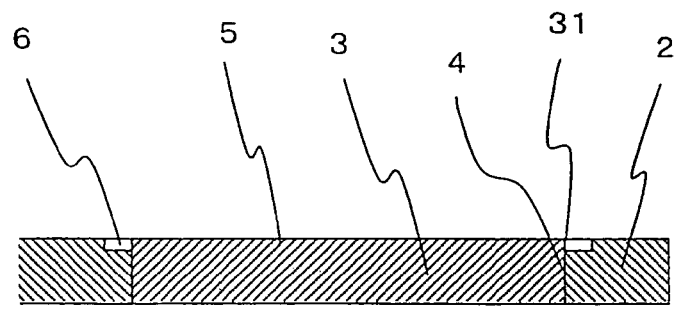
FIG. 2 is a partial vertical sectional view of the heat sink board shown in FIG. 1.
Figure 3:
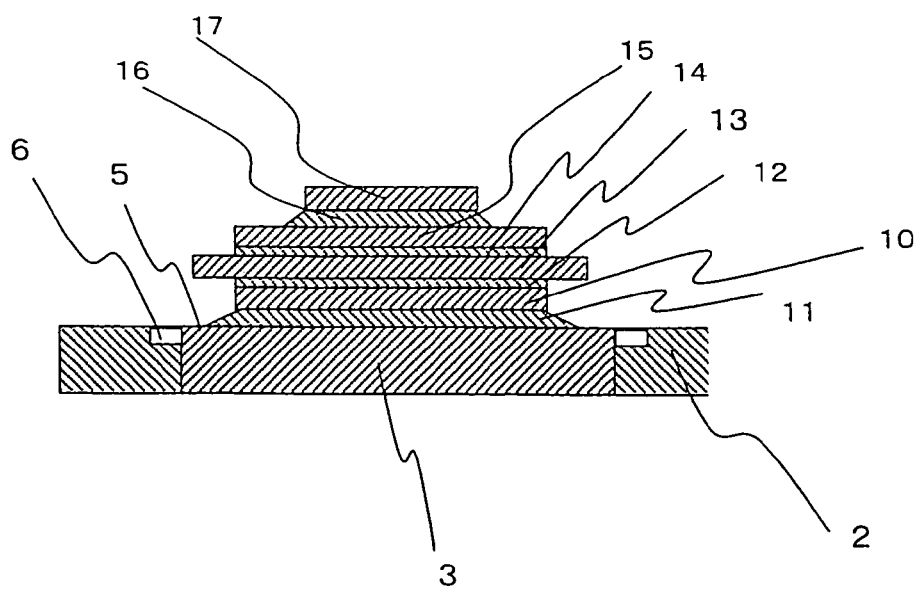
FIG. 3 is a vertical sectional view showing one embodiment of a power module structure according to the present invention.

FIG. 1 is a perspective view showing an example of a heat sink structure according to the present invention, FIG. 2 is an enlarged vertical sectional view of an essential part in FIG. 1, and FIG. 3 is a vertical sectional view of a power module including a semiconductor mounted to a heat sink.

A heat sink board 1 shown in FIGS. 1 and 2 comprises a first heat sink 2 in the form of a plate made of a copper (Cu) material, and a second heat sink 3 made of a material having a smaller linear expansion coefficient than that of Cu, such as a Cu—Mo composite material.

A plurality of through holes 3 are formed in the first heat sink 2 corresponding to the number of components to be mounted. The second heat sink 3 formed as a disk-like chip member is fitted into each of the holes 3 and is integrally bonded to the first heat sink 2 by plastic deformation.

As shown in FIG. 2, the second heat sink 3 is fitted to the first heat sink 2 such that an electronic-component mounted surface 5 of the second heat sink 3 is flush with the surface of the first heat sink 2. An entire peripheral portion of the second heat sink 3 in the vicinity of a boundary between the fitted heat sinks is pressed so as to bring the two heat sinks into an integral structure by plastic flow bonding.

FIG. 3 shows a state where a semiconductor component is mounted to the second heat sink of the heat sink board 1.

A semiconductor is mounted to the heat sink board 1 as shown in FIG. 3, and heat generated from the semiconductor is radiated primarily through the heat sink board 1. A Cu plate 10 is bonded to one surface 5 of the second heat sink 4 by using a solder 11, and a silicon nitride plate 13 is bonded to the Cu plate 10 by using an Ag solder 12. Further, a Cu plate 15 is bonded to the silicon nitride plate 13 by using an Ag solder 14, and a semiconductor chip 17 is bonded to the Cu plate 15 by using a solder 16. In practice, though not shown, aluminum wires, etc. are bonded to the semiconductor chip 17 for electric wiring, thereby constituting a semiconductor device.

Thus, since a heat sink made of a material having a smaller linear expansion coefficient than that of Cu, such as a Cu—Mo composite material, is used as the second heat sink 3 and a semiconductor component is bonded to the second heat sink 3 by soldering, the solder 11 can be avoided from causing a crack due to the difference in linear expansion coefficient between different materials at high temperature, and the expensive Cu—Mo composite material is used in small amount. As a result, it is possible to realize resource saving and to obtain a very rational device.

Further, when the Cu plate 10 constituting the semiconductor device is soldered to the one surface 5 of the second heat sink 3 while applying the solder 11 thereto, the solder is prevented from overflowing outwards by the presence of an annular pressing mark (recess) 6 which has been formed at the time of bonding the second heat sink 3 to the first heat sink 2 through plastic deformation by a pressing force applied from a die.

More specifically, with the formation of the pressing mark (recess) 6, an edge 31 of the second heat sink 3 is exposed such that the second heat sink 3 is apparently projected from the first heat sink 2. Therefore, when the molten solder is applied, the applied solder is avoided from overflowing outwards beyond the one surface of the second heat sink 3 by the action of a surface tension, and the soldering can be easily performed.

A method of manufacturing the heat sink board will be described below.

Figure 4:
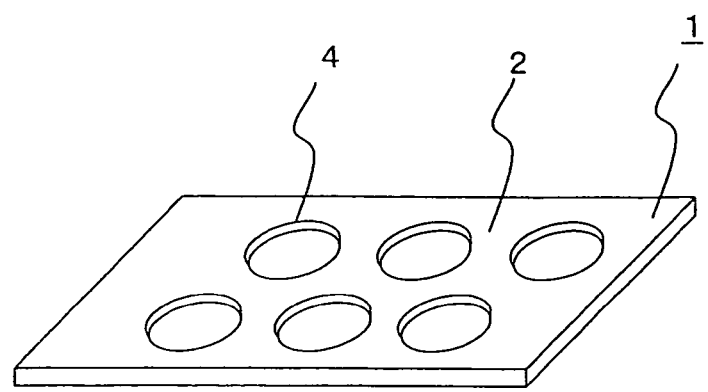
FIG. 4 is a perspective view of a first heat sink constituting the heat sink board according to the present invention.
Figure 5:
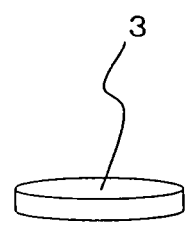
FIG. 5 is a perspective view of a second heat sink constituting the heat sink board according to the present invention.
Figure 6:
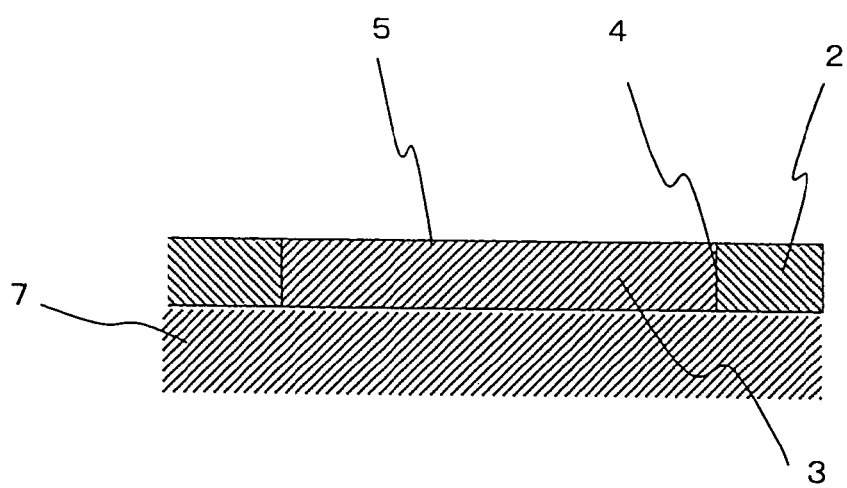
FIG. 6 is a vertical sectional view showing a state where the heat sinks are fitted to each other before bonding of the heat sinks according to a manufacturing method of the present invention.

The plate-like first heat sink 2 made of Cu and having the plurality of through holes 4 formed therein, shown in FIG. 4, and the disk-like second heat sink 3 made of the Cu—Mo composite material, shown in FIG. 5, are placed and set on a lower die 7 in such a state that the second heat sink 3 is fitted into each of the fitting holes 4 of the first heat sink 2 as shown in FIG. 6. Because Cu is so soft as to be plastically deformed with ease and Cu—Mo is harder than Cu, the combination of those materials is suitable for the plastic flow bonding. Even when the fitting hole 4 of the first heat sink 2 is formed by punching and is in a stated hardened as a result of the punching, the difference in hardness between the two materials can be ensured and no problems are caused from the practical point of view.

Figure 7:
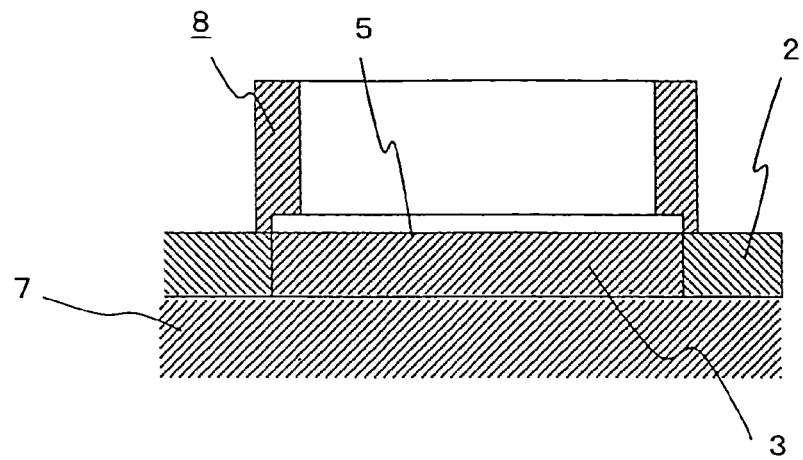
FIG. 7 is a vertical sectional view showing a state immediately before the bonding of the heat sinks according to the manufacturing method of the present invention.
Figure 8:
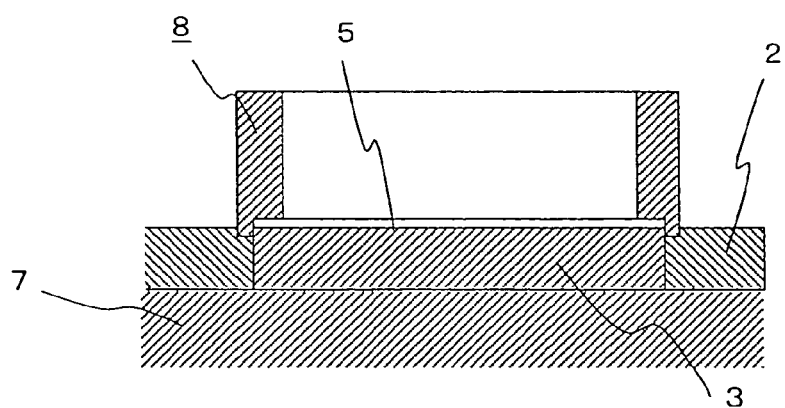
FIG. 8 is a vertical sectional view showing a state after completion of the bonding of the heat sinks by pressing according to the manufacturing method of the present invention.

Then, as shown in FIG. 7, an entire inner peripheral portion of the first heat sink 2, which is positioned in the vicinity of the fitting hole 4, i.e., around the second heat sink 3, is locally pressed by an annular punch 8. The material of the first heat sink 2 is thereby forced to flow plastically, as shown in FIG. 8, so that the heat sinks 2 and 3 are bonded to each other while elastic deformation pressure is confined for close adhesion between the two heat sinks by the action of stresses. Thereafter, the heat sink board 1 is completed by removing the punch 8.

In the heat sink board 1 formed as described above, since the plastic flow of the material of the first heat sink 3 can be developed toward a lateral surface of the second heat sink 3 just by a small punch force when the first heat sink 3 is bonded to the first heat sink 2, parallelism of the heat sink board is not affected and the heat sink board having a very high product accuracy can be obtained.

EMBODIMENT 2

Figure 9:
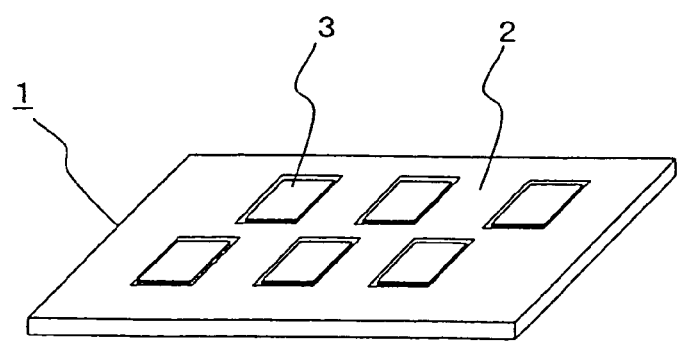
FIG. 9 is a perspective view of a heat sink board according to a second embodiment of the present invention.

While the second heat sink 3 is preferably in the form of a disk, it may be rectangular as shown in FIG. 9, or elliptic.

EMBODIMENT 3

The hole 6 of the first heat sink 2 may be a bottom-equipped hole instead of a through hole.

EMBODIMENT 4

Figure 10:
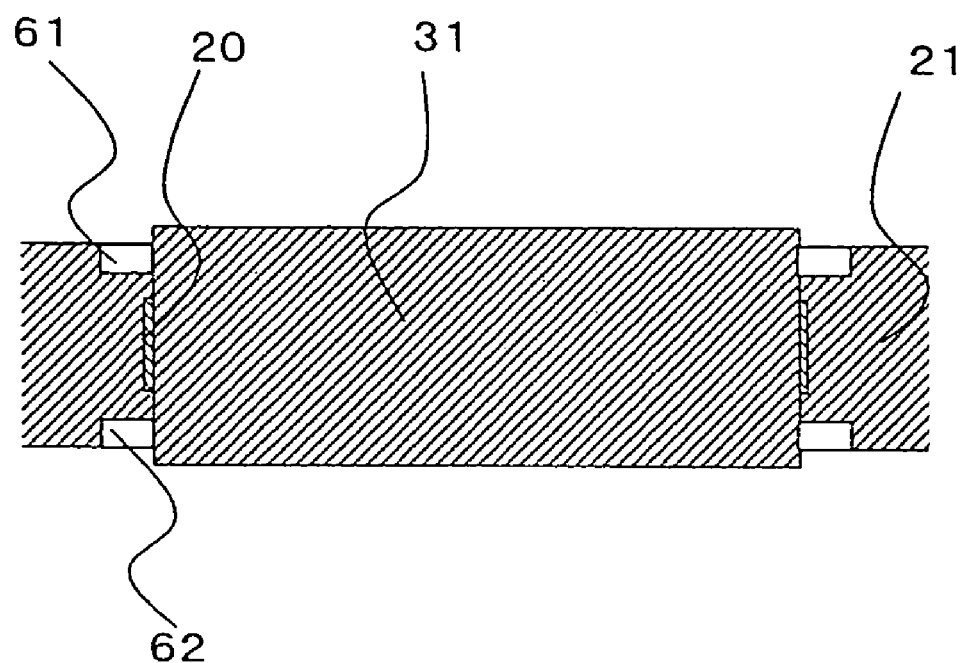
FIG. 10 is a vertical sectional view showing a state after completion of the bonding of the heat sinks by pressing according to a third embodiment of the present invention.

In FIG. 10, a second heat sink 31 is placed in a through hole of a first heat sink 21 with a thermally conductive paste or wax 20 (generally a silicone paste) interposed between them, and the two heat sinks are brought into an integral structure by the plastic flow bonding. In general, the plastic flow bonding of metals is performed, as seen from FIGS. 7 and 8, such that a portion of one of bonded members positioned around the other member is locally pressed by a punch, thus causing a material of the concentrically pressed member to just flow in the vertical direction. Therefore, the material in a portion far away from the fore end of the punch is hardly plastically deformed.

Meanwhile, the performance of a heat radiating member formed by bonding two members to each other depends on the degree of close adhesion between the bonded two members. Taking into account that point, in this embodiment, an annular groove is formed in a substantially central area of the first heat sink 21 or the second heat sink 31 which is not subjected to the plastic deformation pressure, and a thermally conductive paste or wax 20 is applied to the annular groove, followed by punching the first heat sink from both sides. As a result, heat conduction between the first heat sink 21 and the second heat sink 31 is significantly increased and practicability of the heat sink board is improved. In this case, annular pressing marks (recesses) 61 and 62 are formed by the punching on both sides of the first heat sink.

While the punching is generally performed by pressing the boundary between the two members, the punching position can be optionally selected, as shown, depending on the plate thickness, the applied position of the thermally conductive paste or wax 20, etc.

EMBODIMENT 5

Figure 11:
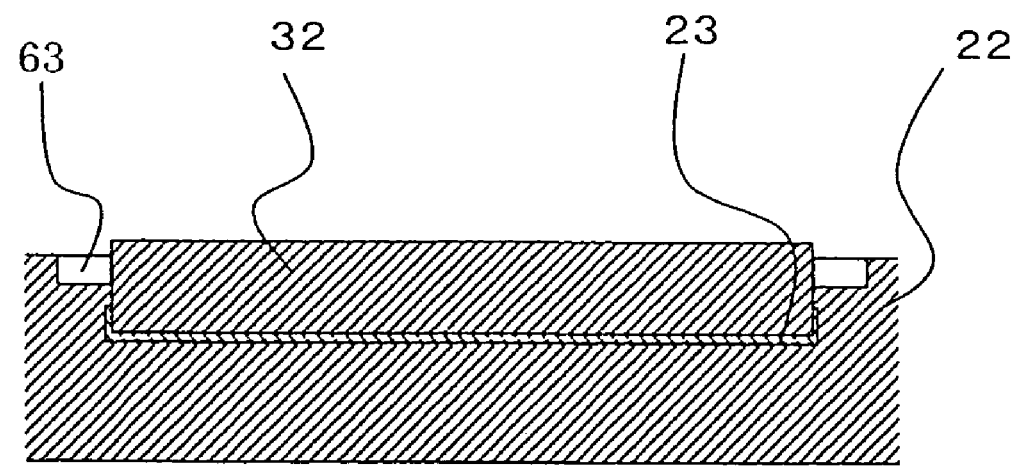
FIG. 11 is a vertical sectional view showing a state after completion of the bonding of the heat sinks by pressing according to a fourth embodiment of the present invention.

In FIG. 11, the method employed in Embodiment 4 to overcome the problem of thermal conduction is applied to a first heat sink 22 having a bottom-equipped hole. A thermally conductive paste or wax 23 is previously applied to a bottom surface of the bottom-equipped hole or a bottom surface of the second heat sink 3. Then, a second heat sink 3 having a diameter slightly smaller than or equal to that of the bottom-equipped hole is placed in the bottom-equipped hole. Thereafter, the boundary between the two heat sinks is pressed by a punch such that a material of the member just below the punch is plastically deformed in the vertical direction and toward a material of the second heat sink 32 for bonding between the two heat sinks. In addition, the thermally conductive paste 23 is compressed to increase the degree of close adhesion.

Any of the above-described embodiments employs the method of forming the heat sink board 1 by integrating the second heat sink 3 with the first heat sink 2 through the plastic flow bonding, and then mounting the electronic component to the heat sink board 1 in the bonded state. However, when the plastic flow bonding capable of bonding the two heat sinks at room temperature with a high accuracy can be used, the method may be modified such that the electronic component is first mounted to the second heat sink 3, and the second heat sink 3 is then integrated with the first heat sink 2 by the plastic flow bonding.

INDUSTRIAL APPLICABILITY

According to the present invention, a heat sink board can be provided which is suitable for mounting an electronic component generating heat in large amount, in particular a semiconductor component, such as an inverter or a power module used in an electric vehicle, and which has a variety of application fields.

The invention claimed is:

1. A power module device, comprising:
    a first heat sink having at least one hole;
    at least one second heat sink being fitted in a respective one of said at least one hole and having an expansion coefficient smaller than an expansion coefficient of said first heat sink;
    a semiconductor component fixed by solder to a surface of said second heat sink; and
    a plastic flow portion stress-bonded for close adhesion to an outer peripheral surface of said second heat sink, said plastic flow portion being material of said first heat sink;
    wherein a recessed-shaped pressing mark is defined by a surface of said first heat sink and an outer peripheral surface of said second heat sink.

2. The power module device according to claim 1, wherein said second heat sink has a disk or elliptic shape.

3. The power module device according to claim 2, wherein a part of the peripheral surface of said heat sink is exposed at said pressing mark having recess shape recessed to the plastic flow bonding.

4. The power module device according to claim 1, wherein a semiconductor chip is fixed on a surface of said second heat sink.

5. The power module device according to claim 4, wherein a width of said pressing mark is relatively small, said pressing mark being formed around said second heat sink.

6. A power module device, comprising:
    a first heat sink having at least one hole and being made of a Cu-based material;

at least one second heat sink being fitted in a respective one of said at least one hole and made of a Cu—Mo composition material having an expansion coefficient smaller than an expansion coefficient of said first heat sink;

a semiconductor component fixed to one surface of said second heat sink by solder; and a plastic flow portion stress-bonded for close adhesion to an outer peripheral surface of said second heat sink, said plastic flow portion being material of said first heat sink;

wherein a recess-shaped pressing mark is defined by a surface of said first heat sink, and outer peripheral surface of said second heat sink.

7. The power module device according to claim 6, wherein said second heat sink has a disk or elliptic shape.

8. The power module device according to claim 7, wherein a part of the peripheral surface of said heat sink is exposed at said pressing mark having recess shape recessed to the plastic flow bonding.

9. The power module device according to claim 6, wherein a semiconductor chip is fixed on a surface of said second heat sink.

10. The power module device according to claim 9, wherein a width of said pressing mark is relatively small, said pressing mark being formed around said second heat sink.

* * * * *